(12) United States Patent
Wu et al.

(10) Patent No.: US 12,376,288 B2
(45) Date of Patent: Jul. 29, 2025

(54) MEMORY AND METHOD FOR FORMING SAME

(71) Applicant: CHANGXIN MEMORY TECHNOLOGIES, INC., Hefei (CN)

(72) Inventors: Gongyi Wu, Hefei (CN); Yachao Xu, Hefei (CN); Xiaoyu Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 430 days.

(21) Appl. No.: 18/152,174

(22) Filed: Jan. 10, 2023

(65) Prior Publication Data

US 2023/0225115 A1     Jul. 13, 2023

Related U.S. Application Data

(63) Continuation of application No. PCT/CN2022/080844, filed on Mar. 15, 2022.

(30) Foreign Application Priority Data

Jan. 7, 2022 (CN) .......................... 202210016780.3

(51) Int. Cl.
    H10B 12/00        (2023.01)
(52) U.S. Cl.
    CPC ....... H10B 12/482 (2023.02); H10B 12/0335 (2023.02); H10B 12/315 (2023.02)
(58) Field of Classification Search
    CPC . H10B 12/0335; H10B 12/482; H10B 12/485
    See application file for complete search history.

(56) References Cited

U.S. PATENT DOCUMENTS

| | | | |
|---|---|---|---|
| 2018/0019244 A1* | 1/2018 | Kim | .................. H01L 21/76224 |
| 2019/0096890 A1* | 3/2019 | Lee | ..................... H10B 12/485 |
| 2019/0355740 A1 | 11/2019 | Hong et al. | |
| 2022/0139924 A1* | 5/2022 | Liao | .................. H01L 21/76897 |
| | | | 257/296 |

FOREIGN PATENT DOCUMENTS

| | | |
|---|---|---|
| CN | 105280608 A | 1/2016 |
| CN | 107240586 A | 10/2017 |
| CN | 107958888 A | 4/2018 |
| CN | 110718550 A | 1/2020 |
| CN | 112951769 A | 6/2021 |

* cited by examiner

*Primary Examiner* — Zandra V Smith
*Assistant Examiner* — Molly K Reida
(74) *Attorney, Agent, or Firm* — Kilpatrick Townsend & Stockton LLP

(57) ABSTRACT

A method for forming a memory includes: forming a bit line structure and a capacitor contact layer, where the bit line structure includes a bit line, a bit line cap layer and a bit line isolation layer, and the capacitor contact layer covers part of a side wall of the bit line isolation layer; forming a stop layer covering the side wall of the bit line isolation layer; forming a capacitor landing layer covering a top surface of the capacitor contact layer; and etching the bit line isolation layer by using the stop layer as an etch stop layer to form an air gap in the bit line isolation layer. Probability of occurrence of a short circuit between the capacitor landing layer and a bit line is reduced.

9 Claims, 7 Drawing Sheets

MEMORY AND METHOD FOR FORMING SAME

CROSS-REFERENCE TO RELATED APPLICATION

This application is a continuation of PCT/CN2022/080844, filed on Mar. 15, 2022, which claims priority to Chinese Patent Application No. 202210016780.3, titled "MEMORY AND METHOD FOR FORMING SAME" and filed on Jan. 7, 2022, the entire contents of which are incorporated herein by reference.

TECHNICAL FIELD

The present disclosure relates to the field of semiconductor fabrication technology, and more particularly, to a memory and a method for forming the same.

BACKGROUND

As a semiconductor apparatus commonly used in electronic devices such as computers, Dynamic Random Access Memory (DRAM) comprises a plurality of memory cells, and each of the memory cells typically includes a transistor and a capacitor. The transistor has a gate electrically connected to a word line, a source electrically connected to a bit line, and a drain electrically connected to the capacitor. A word line voltage of the word line may control turn-on and turn-off of the transistor, such that data information stored in the capacitor can be read or written into the capacitor by means of the bit line.

In a memory structure such as a dynamic random access memory, a node contact (NC) is adjacent to a bit line (BL). Due to limitation of a fabrication process, it is easy to cause short circuit between the node contact and the bit line, thereby reducing yield of the memory, and even leading to failure of the memory in a severe case.

Therefore, how to reduce a probability of occurrence of a short circuit between the node contact and the bit line to improve yield of the memory is a technical problem to be solved urgently at present.

SUMMARY

According to some embodiments, the present disclosure provides a method for forming a memory, including: forming a base substrate, the base substrate comprising a substrate, the substrate comprising a bit line structure and a capacitor contact layer adjacent to the bit line structure, the bit line structure comprising a bit line, a bit line cap layer positioned on a top surface of the bit line, and a bit line isolation layer covering a side wall of the bit line and a side wall of part of the bit line cap layer, the capacitor contact layer covering part of a side wall of the bit line isolation layer; forming a stop layer at least covering the side wall of the bit line isolation layer; forming a capacitor landing layer covering a top surface of the capacitor contact layer; and etching the bit line isolation layer by using the stop layer as an etch stop layer to form an air gap in the bit line isolation layer.

According to some other embodiments, the present disclosure also provides a memory, comprising: a base substrate, the base substrate comprising a substrate, the substrate comprising a bit line structure and a capacitor contact layer adjacent to the bit line structure, the bit line structure comprising a bit line, a bit line cap layer positioned on a top surface of the bit line, and a bit line isolation layer covering a side wall of the bit line and a side wall of part of the bit line cap layer, the capacitor contact layer covering part of a side wall of the bit line isolation layer; a stop layer at least covering the side wall of the bit line isolation layer; a capacitor landing layer covering a top surface of the capacitor contact layer; and an air gap being positioned between the stop layer and the bit line isolation layer and extending into the bit line isolation layer.

DETAILED DESCRIPTION

A memory and a method for forming the same provided by embodiments of the present disclosure are described in detail below with reference to the accompanying drawings.

Figure 1:
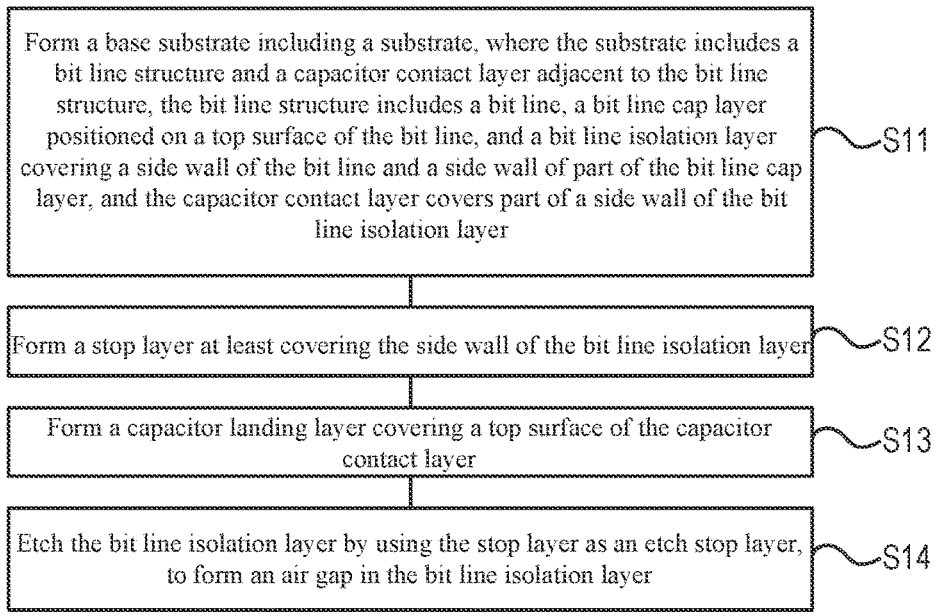
FIG. 1 is a flowchart of a method for forming a memory according to an embodiment of the present disclosure.
Figure 2A:
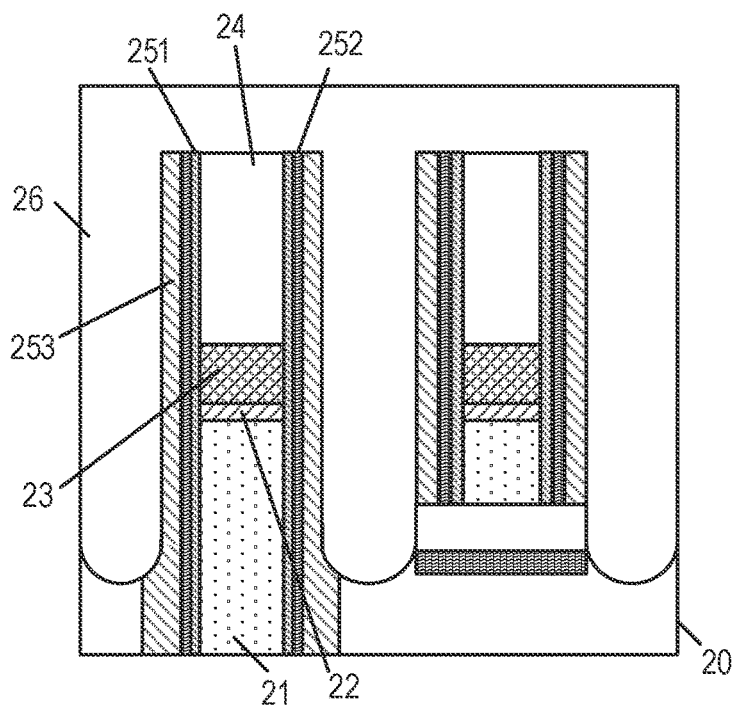
FIGS. 2A to 2J are schematic sectional views of main steps in a process of forming a memory according to an embodiment of the present disclosure.

This embodiment provides a method for forming a memory. FIG. 1 is a flowchart of a method for forming a memory according to an embodiment of the present disclosure, and FIGS. 2A to 2J are schematic sectional views of main steps in a process of forming a memory according to an embodiment of the present disclosure. As shown in FIG. 1 and FIGS. 2A to 2Q, the method for forming the memory includes following steps.

Figure 2B:
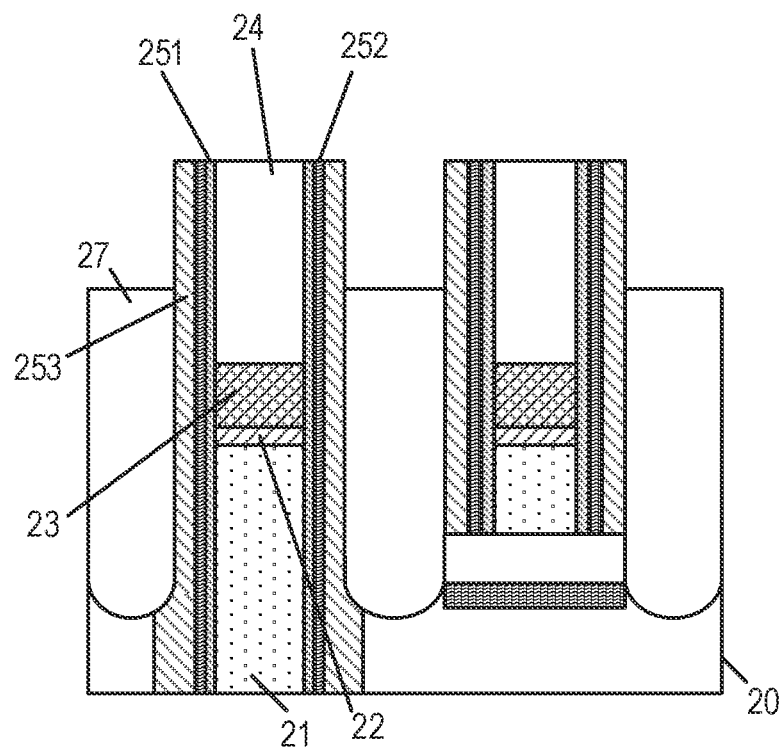
Figure 2C:
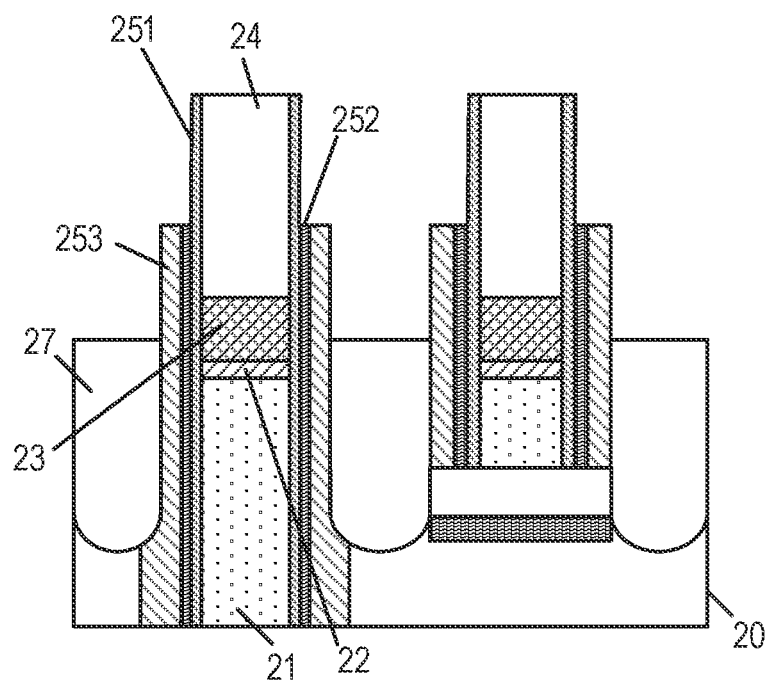

Step S11: forming a base substrate, the base substrate comprising a substrate 20, where the substrate 20 comprises a bit line structure and a capacitor contact layer 27 adjacent to the bit line structure, the bit line structure comprises a bit line, a bit line cap layer 24 positioned on a top surface of the bit line, and a bit line isolation layer covering a side wall of the bit line 23 and a side wall of part of the bit line cap layer 24, and the capacitor contact layer 27 covers part of a side wall of the bit line isolation layer, as shown in FIG. 2C.

In some embodiments, the substrate 20 may be, but is not limited to, a silicon substrate. This embodiment is described by taking an example where the substrate 20 is the silicon substrate. In other examples, the substrate 20 may be a semiconductor substrate such as gallium nitride, gallium arsenide, gallium carbide, silicon carbide, or silicon on insulator (SOI).

In some embodiments, the step of forming the base substrate comprises: providing the substrate 20, where the substrate 20 comprises a bit line contact region and a capacitor contact region adjacent to the bit line contact region; forming the bit line structure on the substrate 20, where the bit line structure comprises the bit line in contact with the bit line contact region, the bit line cap layer 24 positioned on the top surface of the bit line, and the bit line isolation layer covering the side wall of the bit line cap layer 24 and the side wall of the bit line; and forming, on the substrate 20, the capacitor contact layer 27 in contact with the capacitor contact region, where the capacitor contact layer 27 covers part of the side wall of the bit line isolation layer, and the top surface of the capacitor contact layer 27 is positioned below the top surface of the bit line isolation layer.

In some embodiments, the plurality of active areas arranged in the array are provided in the substrate 20. Each active area includes the bit line contact region and the capacitor contact regions, for example, the capacitor contact regions are positioned on the two opposite sides of the bit line contact region. The step of forming the bit line structure on the substrate 20 includes following steps. First, a bit line in electrical contact with the bit line contact region is formed, where the bit line includes a bit line contact layer 21 in contact with the bit line contact region, a diffusion barrier layer 22 positioned on the top surface of the bit line contact layer 21 (i.e., a surface of the bit line contact layer 21 facing away from the substrate 20), and a bit line conductive layer 23 positioned on the top surface of the diffusion barrier layer 22 (i.e., a surface of the diffusion barrier layer 22 facing away from the substrate 20). Next, the bit line cap layer 24 covering the top surface of the bit line is formed. Next, the bit line isolation layer covering the side wall of the bit line cap layer 24 and the side wall of the bit line is formed. The bit line isolation layer may be of the single-layer structure or the multi-layer structure. The material of the bit line contact layer 21 may be doped polysilicon, the material of the diffusion barrier layer 22 may be but is not limited to the titanium nitride (TiN), and the material of the bit line conductive layer 23 may be the metallic material (e.g., the tungsten). The material of the bit line cap layer 24 may be the nitride material (e.g., the silicon nitride).

There are the plurality of bit line structures, and the gap is provided between adjacent two of the plurality of bit line structures. After the plurality of bit line structures are formed, the capacitor contact material 26 filling up the gap between the two adjacent bit line structures and covering the top surfaces of the bit line structures is deposited, as shown in FIG. 2A. Next, the capacitor contact material 26 is etched back to form the capacitor contact layer 27 in electrical contact with the capacitor contact region, where the top surface of the capacitor contact layer 27 is positioned below the top surface of the bit line structure, as shown in FIG. 2B. In this step, after the capacitor contact material 26 is etched back, the top surface of the bit line isolation layer is flush with the top surface of the bit line cap layer. In this embodiment, the top surface refers to the surface facing away from the substrate 20. In this embodiment, "the plurality of" refers to two or more.

Figure 2D:
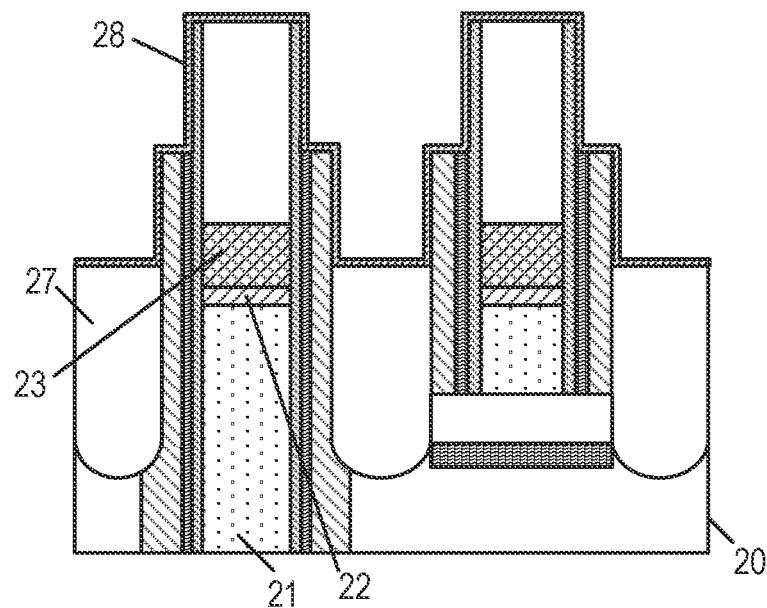
Figure 2E:
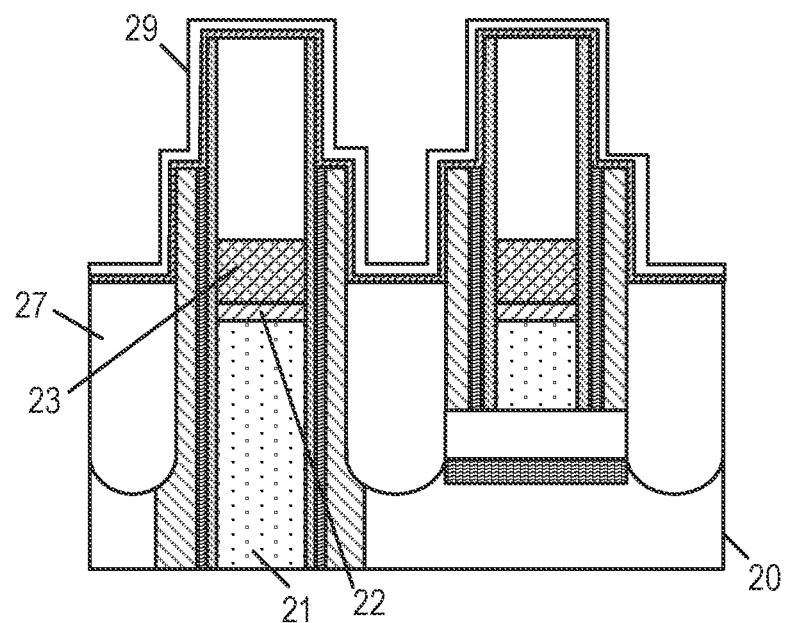
Figure 2F:
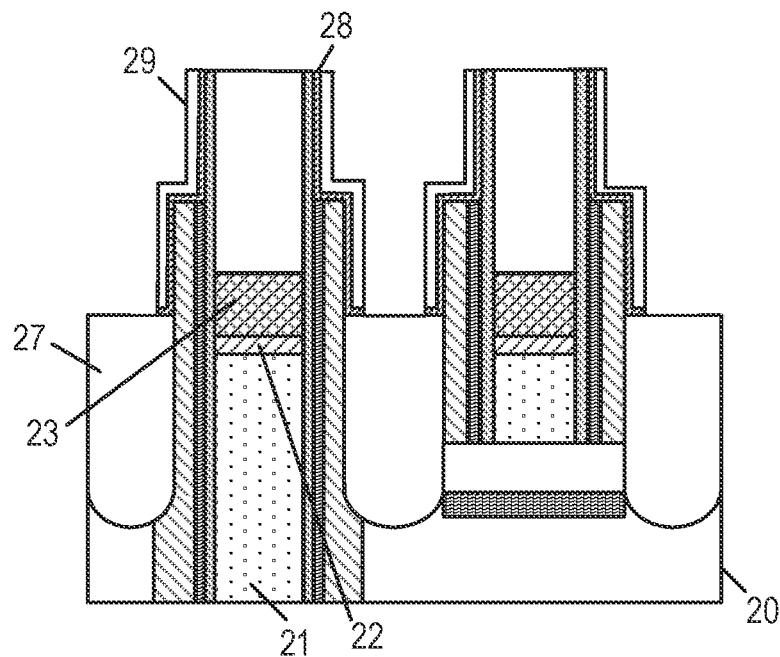

Step S12: forming a stop layer 28 at least covering the side wall of the bit line isolation layer, as shown in FIG. 2F.

In some embodiments, the bit line isolation layer comprises a first isolation sublayer 251 covering the side wall of the bit line cap layer 24 and the side wall of the bit line, a second isolation sublayer 252 covering the first isolation sublayer 251, and a third isolation sublayer 253 covering the second isolation sublayer 252. The step of forming the stop layer 28 at least covering the side wall of the bit line isolation layer comprises: etching a part of the third isolation sublayer 253, a part of the second isolation sublayer 252, and a part of the capacitor contact layer 27 to expose the first isolation sublayer 251 and reduce a height of the capacitor contact layer 27; forming the stop layer 28 covering a side wall of the first isolation sublayer 251, a top surface of the second isolation sublayer 252, and a top surface and a side wall of the third isolation sublayer 253.

In some embodiments, the part of the third isolation sublayer 253, the part of the second isolation sublayer 252, and the part of the capacitor contact layer 27 may be removed by means of the dry etching process, such that both the top surface of the third isolation sublayer 253 and the top surface of the second isolation sublayer 252 are positioned below the top surface of the first isolation sublayer 251, and the height of the capacitor contact layer 27 is reduced, for example, the top surface of the capacitor contact layer 27 is positioned below the top surface of the bit line conductive layer 23, as shown in FIG. 2C. Next, the insulating material may be deposited on the base substrate by means of the atomic layer deposition process to form the stop layer 28 covering the surface of the bit line structure and the surface of the capacitor contact layer 27, as shown in FIG. 2D. Forming the stop layer 28 by means of the atomic layer deposition process is advantageous to improving the density of the stop layer 28, thereby further improving the etching barrier effect of the stop layer 28.

In some embodiments, the step of forming the stop layer 28 covering the side wall of the first isolation sublayer 251, the top surface of the second isolation sublayer 252, and the top surface and the side wall of the third isolation sublayer 253 comprises: forming the stop layer 253 covering a top surface of the bit line cap layer 24, the side wall and a top surface of the first isolation sublayer 251, the top surface of the second isolation sublayer 252, the top surface and the side wall of the third isolation sublayer 253, and the top surface of the capacitor contact layer 27; forming a barrier layer 29 covering a surface of the stop layer 28, as shown in FIG. 2E; and removing the barrier layer 29 and the stop layer 28 covering the top surface of the bit line cap layer 24, the top surface of the first isolation sublayer 251, and the top surface of the capacitor contact layer 27, as shown in FIG. 2F.

In some embodiments, a material of the barrier layer 29 may be an insulating material such as a nitride material (for example, silicon nitride). In one aspect, the capacitor landing layer formed subsequently may be electrically isolated from the bit line structure by means of the barrier layer 29. In another aspect, the barrier layer 29 can also prevent conductive particles in the capacitor landing layer from diffusing outwards. The thickness of the barrier layer 29 may range from 1 nm to 4 nm, to ensure the stability of the electrical properties of the capacitor landing layer without taking up more space of the capacitor landing layer while ensuring the isolation and barrier properties.

Figure 2G:
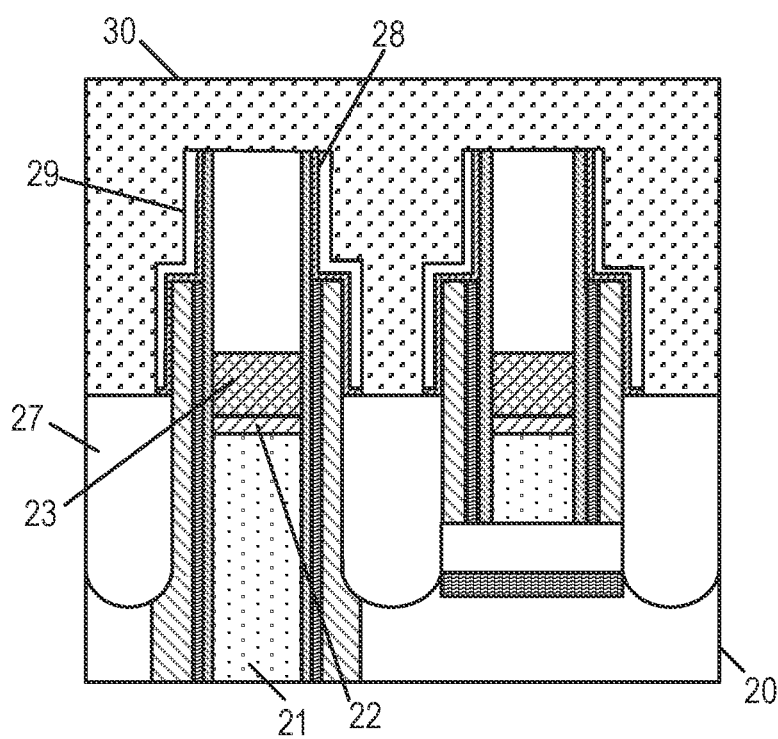
Figure 2H:
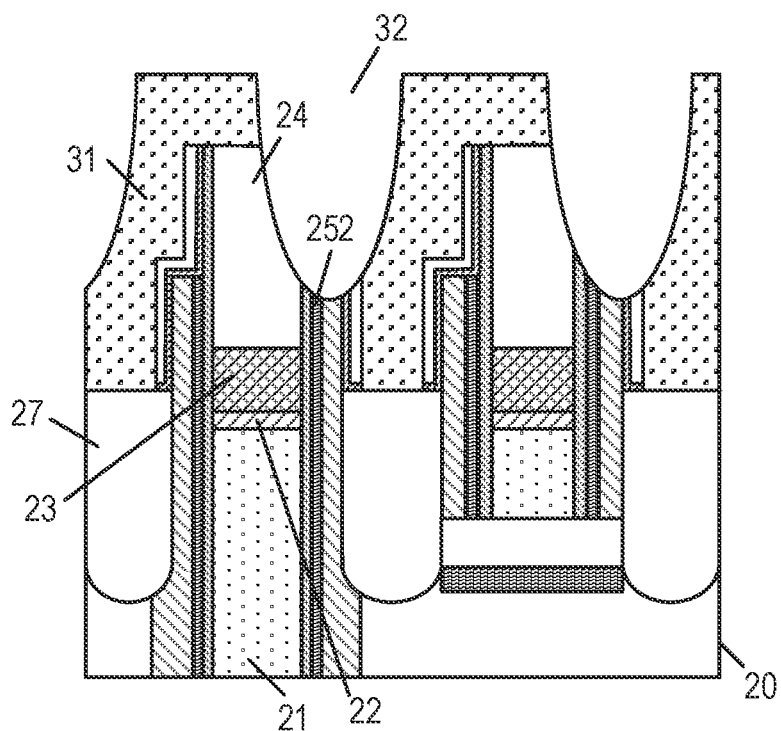

Step S13: forming a capacitor landing layer 31 covering a top surface of the capacitor contact layer 27, as shown in FIG. 2H.

In some embodiments, the step of forming the capacitor landing layer 31 covering the top surface of the capacitor contact layer 27 comprises: forming a conductive material layer 30 covering the top surface of the capacitor contact layer 27, a surface of the barrier layer 29, and a top surface of the bit line structure, as shown in FIG. 2G; and etching the conductive material layer 30 to form an opening 32 at least exposing the second isolation sublayer 252, where the opening 32 is configured to divide the conductive material layer 30 into the plurality of capacitor landing layers 31, as shown in FIG. 2H.

In some embodiments, the step of etching the conductive material layer 30 includes: etching the conductive material layer 30, the first isolation sublayer 251, the second isolation sublayer 252, the third isolation sublayer 253, the stop layer 28, and the barrier layer 29 to form the opening 32 exposing the first isolation sublayer 251, the second isolation sublayer 252, the third isolation sublayer 253, the stop layer 28, the barrier layer 29, and the bit line cap layer 24.

In some embodiments, a conductive material such as tungsten is deposited on the top surface of the capacitor contact layer 27, the surface of the barrier layer 29, and the top surface of the bit line structure to form the conductive material layer 30. Next, the conductive material layer 30 may be etched by means of a dry etching process while the bit line isolation layer is opened to form the opening 32 as shown in FIG. 2H. The opening 32 divides the conductive material layer 30 to form the plurality of capacitor landing layers 31. The capacitor landing layers 31 are in electrical contact with the capacitor contact layer 27. After the bit line isolation layer is opened, the second isolation sublayer 252 is exposed, such that it is convenient to remove the second isolation sublayer 252 subsequently.

Figure 2I:
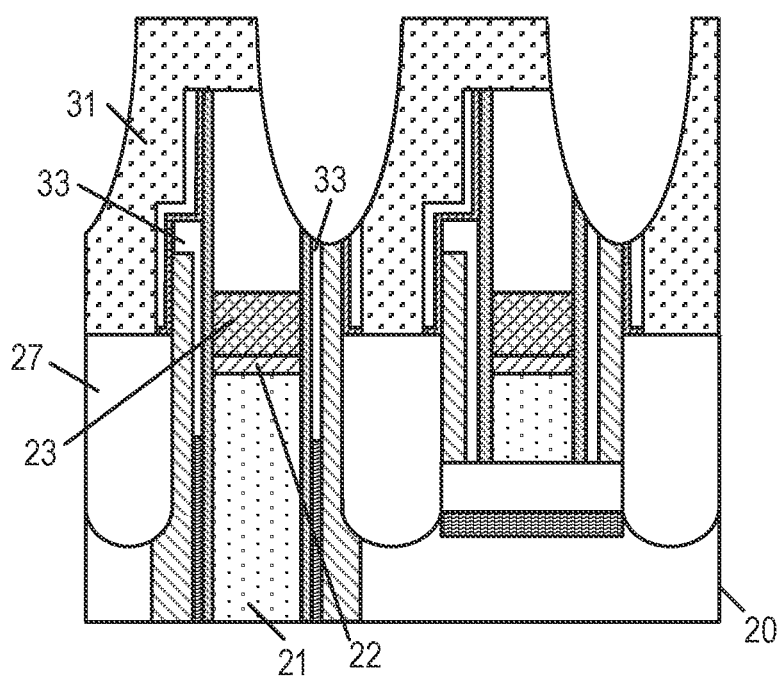
Figure 2J:
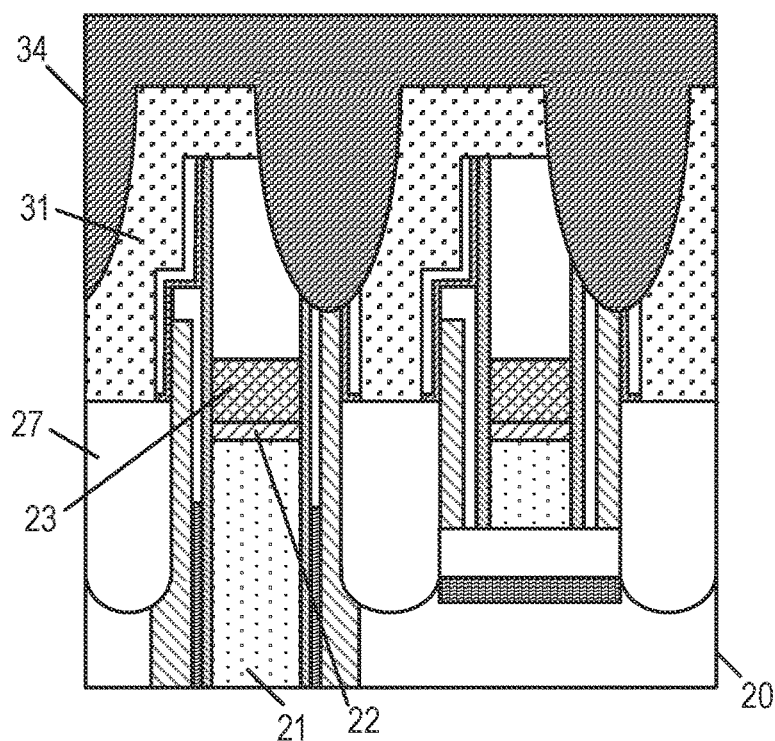

Step S14: etching the bit line isolation layer by using the stop layer 28 as an etch stop layer, to form an air gap 33 in the bit line isolation layer, as shown in FIG. 2I.

In some embodiments, the step of forming the air gap in the bit line isolation layer comprises: etching the second isolation sublayer 252 along the opening 32 by using the stop layer 28 as the etch stop layer to form the air gap 33 positioned between the first isolation sublayer 251 and the third isolation sublayer 253.

In some embodiments, after the opening 32 is formed, a part of the second isolation sublayer 252 may be etched along the opening 32 by means of a wet etching process, such that the air gap 33 is formed between the first isolation sublayer 251 and the third isolation sublayer 253. In the process of etching the second isolation sublayer 252, because time for etching an upper part (a part farther away from the substrate 20) of the bit line isolation layer is longer than that for etching a lower part (a part closer to the substrate 20) of the bit line isolation layer, transverse etching amount of the upper part of the bit line isolation layer is greater than that of the lower part of the bit line isolation layer, such that the width of the top of the air gap 33 formed is greater than that of the bottom of the air gap. Meanwhile, the stop layer 28 serves as the etch stop layer, which can avoid the excessive etching in a transverse direction (i.e., the direction parallel to the top surface of the substrate 20), thereby reducing the probability of occurrence of the short circuit between the capacitor landing layer 31 and the bit line.

A material of the stop layer 28 should have better resistance to an etchant (e.g., HF used in the wet etching process or $NF_3$ used in the dry etching process) used in the process of etching the second isolation sublayer 252, to avoid causing damage to the stop layer 28 in the process of etching the bit line isolation layer to form the air gap 33.

To ensure that the stop layer 28 is not damaged in the process for removing the second isolation sublayer 252, in some embodiments, the etching selectivity between the stop layer 28 and the second isolation sublayer 252 is greater than 100.

For example, a material of the first isolation sublayer 251 and a material of the third isolation sublayer 253 are both nitride materials (e.g. silicon nitride), a material of the second isolation sublayer 252 is an oxide material (e.g. silicon dioxide), and a material of the stop layer 28 may be a carbonitride material (e.g. SiCN or SiBCN).

In some embodiments, a thickness of the stop layer 28 ranges from 0.1 nm to 10 nm. In an example, the stop layer 28 has a thickness of 1 nm to 4 nm, e.g., 1 nm, 2 nm, 3 nm, or 4 nm.

After the air gap 33 is formed, the isolation material is filled into the opening 32, and a capacitor isolation layer 34 at least filling up the opening 32 is formed to electrically isolate the adjacent capacitor landing layers 31.

Figure 3:
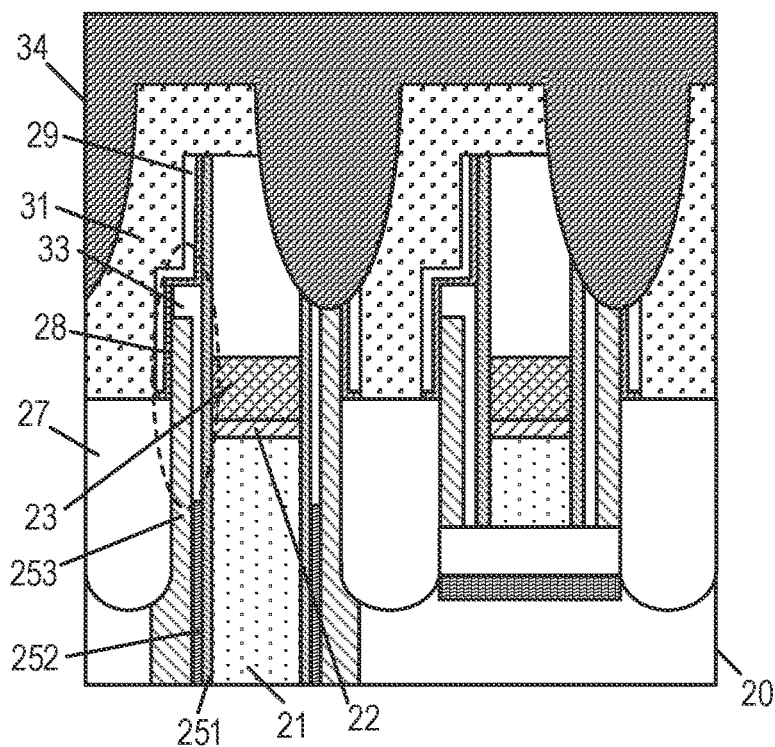
FIG. 3 is a schematic sectional view of a memory according to an embodiment of the present disclosure.
Figure 4:
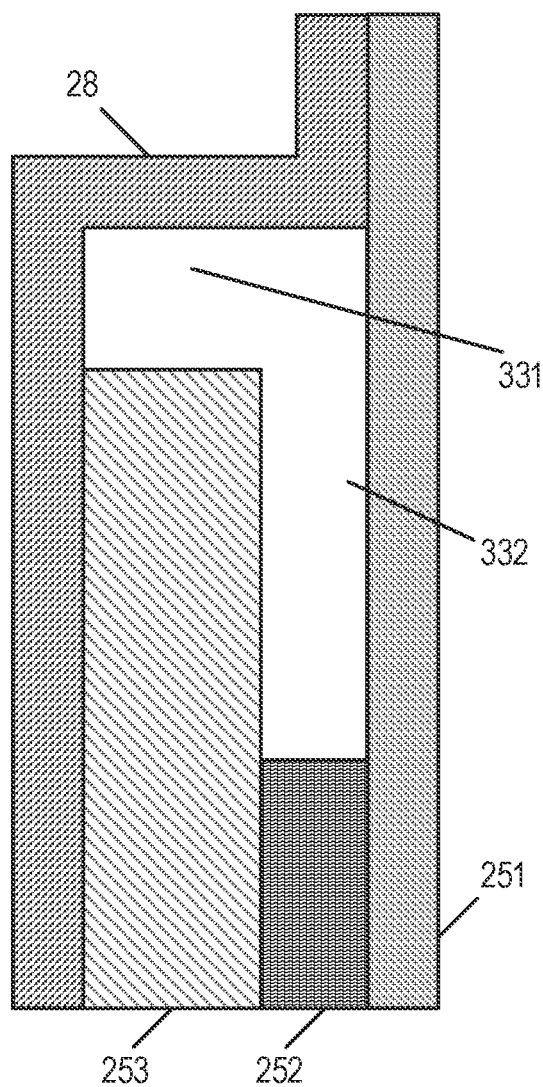
FIG. 4 is a schematic enlarged view in a dashed line circle of FIG. 3.

Moreover, this embodiment also provides a memory. FIG. 3 is a schematic sectional view of the memory according to an embodiment of the present disclosure, and FIG. 4 is a schematic enlarged view in a dashed line circle of FIG. 3. The memory provided by this embodiment may be formed by using the method for forming a memory as shown in FIG. 1 and FIGS. 2A to 2J. As shown in FIGS. 2A to 2J, FIG. 3 and FIG. 4, the memory includes: a base substrate comprising a substrate 20, the substrate 20 comprising a bit line structure and a capacitor contact layer 27 adjacent to the bit line structure, where the bit line structure comprises a bit line, a bit line cap layer 24 positioned on a top surface of the bit line, and a bit line isolation layer covering a side wall of the bit line and a side wall of part of the bit line cap layer, and the capacitor contact layer 27 covers part of a side wall of the bit line isolation layer; a stop layer 28 at least covering the side wall of the bit line isolation layer; a capacitor landing layer 31 covering the top surface of the capacitor contact layer 27; and an air gap 33 positioned between the stop layer 28 and the bit line isolation layer and extending into the bit line isolation layer.

In some embodiments, the bit line isolation layer comprises a first isolation sublayer 251 covering the side wall of the bit line cap layer 24 and the side wall of the bit line, a second isolation sublayer 252 covering the first isolation sublayer 251, and a third isolation sublayer 253 covering the second isolation sublayer 252. Both a top surface of the second isolation sublayer 252 and a top surface of the third sub isolation layer 253 are lower than a top surface of the first isolation sublayer 251.

The stop layer 28 is continuously distributed between the capacitor landing layer 31 and the third isolation sublayer 253, between the air gap 33 and the capacitor landing layer 31, and between the capacitor landing layer 31 and the first isolation sublayer 251.

In some embodiments, the air gap 33 includes: a first portion 331 positioned above the third isolation sublayer 253 and distributed between the stop layer 28 and the first isolation sublayer 251; and a second portion 332 communicating with the first portion 331, where the second portion 332 is positioned above the second isolation sublayer 252 and is distributed between the first isolation sublayer 251 and the third isolation sublayer 253, and a width of the first portion 331 greater than a width of the second portion 332.

In some embodiments, an etching selectivity between the stop layer 28 and the second isolation sublayer 252 is greater than 100.

In some embodiments, the memory also includes: a barrier layer 29 positioned between the stop layer 28 and the capacitor landing layer 31.

In some embodiments, a thickness of the stop layer ranges from 0.1 nm to 10 nm.

In the memory and the method for forming the same provided by some embodiments of the present disclosure, the stop layer at least covering the side wall of the bit line isolation layer is formed, a transverse boundary in the etching process is defined by using the stop layer as the etch stop layer in the process of etching the bit line isolation layer to form the air gap, which avoids excessive transverse etching, thereby reducing the probability of occurrence of the short circuit between the capacitor landing layer and the bit line, which is advantageous to improving the yield of the memory.

The above merely are some embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A method for forming a memory, comprising:
   forming a base substrate, the base substrate comprising a substrate, the substrate comprising a bit line structure and a capacitor contact layer adjacent to the bit line structure, the bit line structure comprising a bit line, a bit line cap layer positioned on a top surface of the bit line, and a bit line isolation layer covering a side wall of the bit line and a side wall of part of the bit line cap layer, the capacitor contact layer covering part of a side wall of the bit line isolation layer;
   forming a stop layer at least covering the side wall of the bit line isolation layer;
   forming a capacitor landing layer covering a top surface of the capacitor contact layer; and etching the bit line isolation layer by using the stop layer as an etch stop layer to form an air gap in the bit line isolation layer.

2. The method for forming the memory according to claim 1, wherein the forming the base substrate comprises:
   providing the substrate, the substrate comprising a bit line contact region and a capacitor contact region adjacent to the bit line contact region;
   forming the bit line structure on the substrate, the bit line structure comprising the bit line in contact with the bit line contact region, the bit line cap layer positioned on the top surface of the bit line, and the bit line isolation layer covering the side wall of the bit line cap layer and the side wall of the bit line; and
   forming, on the substrate, the capacitor contact layer in contact with the capacitor contact region, the capacitor contact layer covering part of the side wall of the bit line isolation layer, and the top surface of the capacitor contact layer being positioned below the top surface of the bit line isolation layer.

3. The method for forming the memory according to claim 1, wherein the bit line isolation layer comprises a first isolation sublayer covering the side wall of the bit line cap layer and the side wall of the bit line, a second isolation sublayer covering the first isolation sublayer, and a third isolation sublayer covering the second isolation sublayer; the forming the stop layer at least covering the side wall of the bit line isolation layer comprises:
   etching a part of the third isolation sublayer, a part of the second isolation sublayer, and a part of the capacitor contact layer to expose the first isolation sublayer and reduce a height of the capacitor contact layer;
   forming the stop layer covering a side wall of the first isolation sublayer, a top surface of the second isolation sublayer, and a top surface and a side wall of the third isolation sublayer.

4. The method for forming the memory according to claim 3, wherein the forming the stop layer covering the side wall of the first isolation sublayer, the top surface of the second isolation sublayer, and the top surface and the side wall of the third isolation sublayer comprises:
   forming the stop layer covering a top surface of the bit line cap layer, the side wall and a top surface of the first isolation sublayer, the top surface of the second isolation sublayer, the top surface and the side wall of the third isolation sublayer, and the top surface of the capacitor contact layer;
   forming a barrier layer covering a surface of the stop layer; and
   removing the barrier layer and the stop layer covering the top surface of the bit line cap layer, the top surface of the first isolation sublayer, and the top surface of the capacitor contact layer.

5. The method for forming the memory according to claim 4, wherein the forming the capacitor landing layer covering the top surface of the capacitor contact layer comprises:
   forming a conductive material layer covering the top surface of the capacitor contact layer, a surface of the barrier layer, and a top surface of the bit line structure;
   etching the conductive material layer to form an opening at least exposing the second isolation sublayer, the opening being configured to divide the conductive material layer into the plurality of capacitor landing layers.

6. The method for forming the memory according to claim 5, wherein the etching the conductive material layer comprises:
   etching the conductive material layer, the first isolation sublayer, the second isolation sublayer, the third isolation sublayer, the stop layer, and the barrier layer to form the opening exposing the first isolation sublayer, the second isolation sublayer, the third isolation sublayer, the stop layer, the barrier layer, and the bit line cap layer.

7. The method for forming the memory according to claim 5, wherein the forming the air gap in the bit line isolation layer comprises:
   etching the second isolation sublayer along the opening by using the stop layer as the etch stop layer to form the air gap positioned between the first isolation sublayer and the third isolation sublayer.

8. The method for forming the memory according to claim 7, wherein an etching selectivity between the stop layer and the second isolation sublayer is greater than 100.

9. The method for forming the memory according to claim 1, wherein a thickness of the stop layer ranges from 0.1 nm to 10 nm.

* * * * *